(12) United States Patent
Paun

(10) Patent No.: US 6,850,197 B2
(45) Date of Patent: Feb. 1, 2005

(54) PRINTED CIRCUIT BOARD ANTENNA STRUCTURE

(75) Inventor: Cristian Paun, Goleta, CA (US)

(73) Assignee: M&FC Holding, LLC, Raleigh, NC (US)

( * ) Notice: Subject to any disclaimer, the term of this patent is extended or adjusted under 35 U.S.C. 154(b) by 34 days.

(21) Appl. No.: 10/355,312

(22) Filed: Jan. 31, 2003

(65) Prior Publication Data

US 2004/0150562 A1 Aug. 5, 2004

(51) Int. Cl.$^7$ .................................................. H01Q 1/24
(52) U.S. Cl. ............................... 343/702; 343/700 MS
(58) Field of Search ........................... 343/702, 700 MS, 343/846, 848, 873; H01Q 1/24, 1/38

(56) References Cited

U.S. PATENT DOCUMENTS

| | | | |
|---|---|---|---|
| 5,495,260 A | 2/1996 | Couture | 343/795 |
| 5,657,028 A | 8/1997 | Sanad | 343/700 |
| 5,709,832 A | 1/1998 | Hayes et al. | 264/272.11 |
| 5,841,401 A | 11/1998 | Bodley et al. | 343/700 |
| 5,844,525 A | 12/1998 | Hayes et al. | 343/702 |
| 5,945,954 A | 8/1999 | Johnson | 343/702 |
| 5,949,385 A | 9/1999 | Asakura et al. | 343/895 |
| 5,999,140 A | 12/1999 | Johnson | 343/795 |
| 6,008,774 A | 12/1999 | Wu | 343/828 |
| 6,031,491 A | 2/2000 | Daniel et al. | 343/700 |
| 6,046,703 A | 4/2000 | Wang et al. | 343/795 |
| 6,067,052 A | 5/2000 | Rawles et al. | 343/741 |
| 6,111,549 A | 8/2000 | Feller | 343/795 |
| 6,353,443 B1 | 3/2002 | Ying | 345/702 |
| 6,366,259 B1 | 4/2002 | Pruett et al. | 343/853 |
| 6,396,456 B1 | 5/2002 | Chiang et al. | 343/795 |
| 6,486,836 B1 * | 11/2002 | Hill | 343/702 |
| 6,593,897 B1 * | 7/2003 | McConnell | 343/841 |
| 6,661,380 B1 * | 12/2003 | Bancroft et al. | 343/700 MS |
| 2002/0101382 A1 | 8/2002 | Takayoshi et al. | 343/702 |
| 2004/0027288 A1 * | 2/2004 | Okubora et al. | 343/700 MS |

FOREIGN PATENT DOCUMENTS

| | | |
|---|---|---|
| DE | 201 12 076 | 10/2001 |
| EP | 1 248 316 | 10/2002 |
| WO | 01/80355 | 10/2001 |

* cited by examiner

Primary Examiner—Hoanganh Le
(74) Attorney, Agent, or Firm—Andrus, Sceales, Starke & Sawall, LLP

(57) ABSTRACT

A printed circuit board antenna structure for the transmission of radio frequency energy. The printed circuit board antenna of the present invention includes a circuit board subassembly having a component mounting section and an antenna section. The second planar surface of the circuit board includes a layer of conductive material along the component mounting section to define a ground plane. A radiating and impedance matching trace is applied to the second planar surface of the circuit board along the antenna section. The radiating and impedance matching trace includes a radiating strip extending parallel to the center axis of the circuit board and an impedance matching strip having a plurality of individual legs extending perpendicular to the center axis. The impedance matching strip has defined dimensions to match the impedance of the antenna driving circuit.

19 Claims, 9 Drawing Sheets

PRINTED CIRCUIT BOARD ANTENNA STRUCTURE

FIELD OF THE INVENTION

The present invention generally relates to the field of antennas for transmitting radio frequency signals. More particularly, the present invention relates to a printed antenna comprised of thin layers of electrically conductive material that are bonded onto a thin, planar dielectric material such as a printed circuit board (PCB) that also serves as a platform for antenna driving circuitry.

BACKGROUND OF THE INVENTION

Presently, the desire for antennas for transmitting radio frequency signals from a small, compact location to an external receiver has grown significantly. For example, antennas for transmitting radio frequency signals from a recording or monitoring device, such as a thermostat, water meter, gas meter, electric meter or any similar type of device to a remote location that is configured to monitor and record the status of the device have become increasingly desirable. Since many of the devices utilizing an RF antenna are produced in very large quantities, a desire and need exists for an antenna that can transmit the RF signals a desired distance while being low in cost to produce and assemble.

Typically, an antenna structure is formed separate from the printed circuit board including the antenna driving circuit. The separate antenna device increases the cost to produce the combination of the antenna and driving circuit while also increasing the size of the compartment needed to house the two separate components.

In an effort to avoid the use of external antennas, manufacturers have utilized micro strip patch antennas, the characteristics of which are well known. Briefly, a micro strip patch antenna includes a dielectric material, such as a printed circuit board, which has two opposed surfaces. One of the surfaces is coated with an electrically conductive layer that functions as a ground plane and the opposed surface has an essentially rectangular or circular shaped electrically conductive layer (micro strip patch) disposed to extend over the ground plane. The micro strip patch antenna presents a thin resonating cavity where standing electromagnetic waves can exist and can be radiated from the edges of the antenna.

Micro strip patch antennas, however, have many limitations, including the ability to radiate only above the ground plane. Further, because the micro strip patch antenna has a resonant cavity that greatly depends upon the thickness of the dielectric material utilized, tuning such an antenna is difficult. Thus, the printed circuit board forms a important part of the antenna structure, even though a PCB is typically formulated with rather low tolerances.

Therefore, it is an object of the present invention to provide a printed antenna that can be formed directly on a dielectric material, such as a printed circuit board, that also is used to mount the antenna driving circuitry. Further, the present invention seeks to provide a printed circuit antenna that includes both a radiating strip that aids in improving the directability of the antenna and a impedance matching strip that allow the antenna to match the impedance of the antenna driving circuit by increasing or decreasing the length and configuration of the impedance matching strip.

SUMMARY OF THE INVENTION

The present invention is a printed antenna for the transmission of electromagnetic waves, such as radio frequency signals, from an electrical device coupled to the printed antenna. The printed antenna of the present invention is designed for use in communicating information from a measurement device, such as an electronic thermostat, gas meter, water meter, electric meter or similar device. However, the printed antenna of the present invention can be utilized for transmitting information from any device that incorporates an antenna driving circuit mounted to a printed circuit board.

The printed antenna of the present invention includes a substantially planar printed circuit board that is formed from a dielectric material. The printed circuit board is a conventional component and is utilized to mount an antenna driving circuit that operates to generate electromagnetic waves for transmission and receives electromagnetic information from a remote transmission device. The circuit board includes a planar first surface and a planar second surface that are separated by a material thickness. Preferably, the circuit board extends along a longitudinal center axis such that the length of the circuit board measured along the center axis is greater than the width of the circuit board.

The circuit board is a unitary structure and is configured to include both a mounting section and an antenna section. The mounting section of the circuit board includes the antenna driving circuitry for the printed antenna. Specifically, the antenna driving circuitry is mounted to the first surface of the circuit board within the mounting section.

The mounting section of the second planar surface of the circuit board includes a coating of electrically conductive material covering substantially all of the mounting section. Thus, the coating of electrically conductive material that defines the ground plane is positioned on the opposite side of the circuit board from the antenna driving circuit such that the antenna driving circuit is positioned opposite the area defined by the ground plane. The coating of electrically conductive material covering the second planar surface of the mounting section of the circuit board forms a ground plane for the circuit board and acts as a radiating element for transmitting electromagnetic waves generated by the antenna driving circuit.

The printed antenna further includes a radiating strip that is formed on the second planar surface of the circuit board along the antenna section. The radiating strip is electrically connected to the antenna driving circuit and functions to enhance the radiation pattern generated by the radiating element formed by the electrically conductive material. The radiating strip is formed on the second planar surface of the circuit board and extends parallel to the center axis of the circuit board. Preferably, the radiating strip is formed along one of the side edges of the circuit board and extends to the outer edge of the circuit board along the side edge.

In addition to the radiating strip, the antenna section includes an impedance matching strip applied to the second planar surface of the circuit board along the antenna section. The impedance matching strip is joined to the radiating strip to define a continuous length of electrically conductive material applied to the second planar surface of the antenna section. The impedance matching strip is coupled to the radiating strip and has a length such that the impedance matching strip functions to match the impedance of the antenna driving circuit.

In the preferred embodiment of the invention, the impedance matching strip includes at least one leg connected to the radiating strip and extending perpendicularly to the radiating strip. The first leg of the impedance matching strip is generally formed along the outer edge of the circuit board and extends from the first side edge to the second side edge of the circuit board.

In a preferred embodiment of the invention, the impedance matching strip has a serpentine configuration and includes a plurality of legs, each of which extend perpendicular to the radiating strip. The legs of the impedance matching strip are joined to each other by connector portions such that the entire impedance matching strip is a continuous trace applied to the second planar surface of the antenna section.

In a preferred embodiment of the invention, one of the legs of the impedance matching strip is shorter than the remaining legs such that the leg acts as a tuning stub. The length and characteristics of the tuning stub can be adjusted to fine tune the impedance matching strip to the impedance requirement of the antenna driving circuit.

Various other features, objects and advantages of the invention will be made apparent from the following description taken together with the drawings.

BRIEF DESCRIPTION OF THE DRAWINGS

The drawings illustrate the best mode presently contemplated of carrying out the invention.

In the drawings.

DETAILED DESCRIPTION OF THE PREFERRED EMBODIMENT

Figure 1:
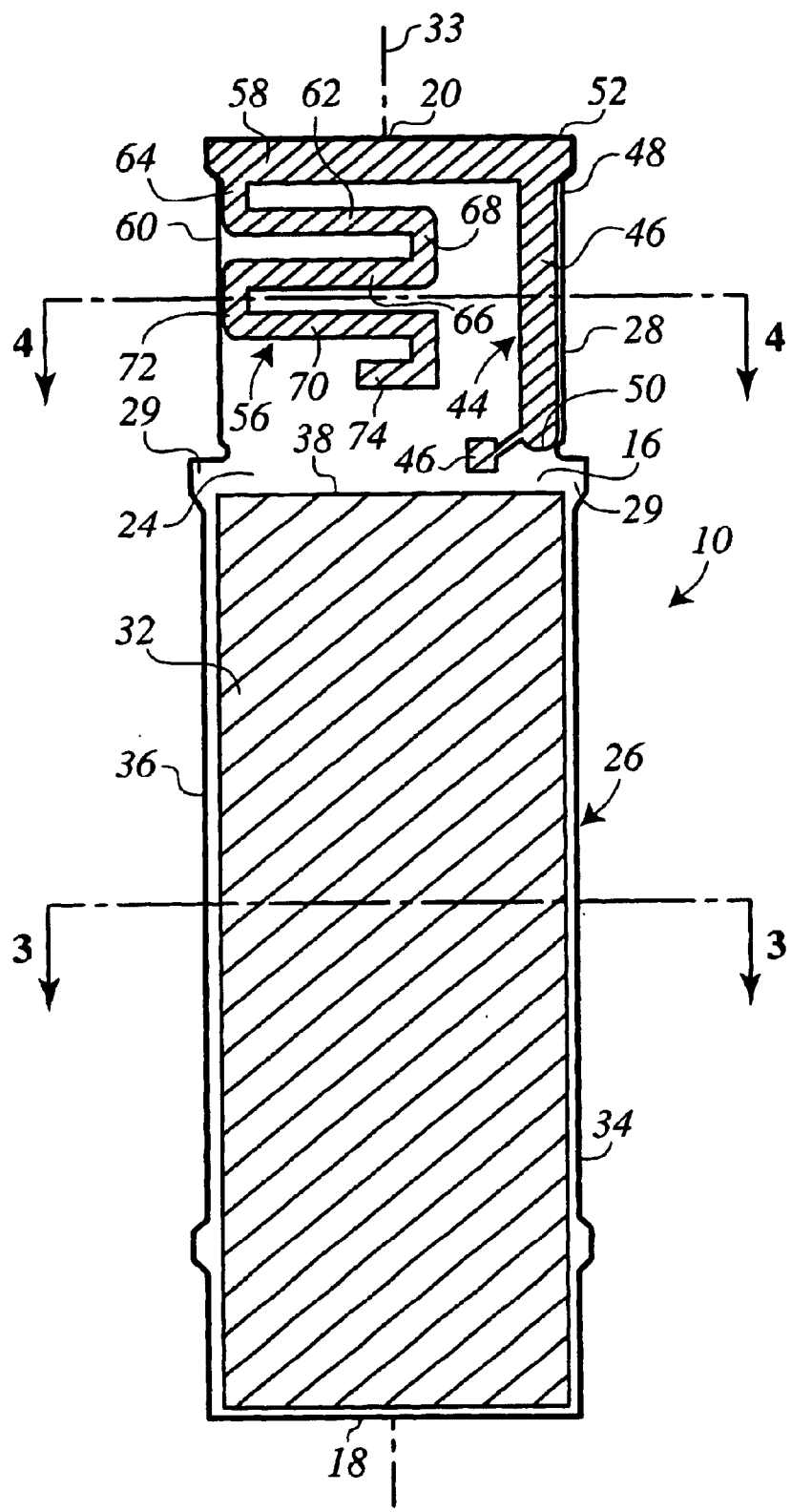
FIG. 1 is a front plan view of a printed circuit board including the printed antenna structure of the present invention.
Figure 2:
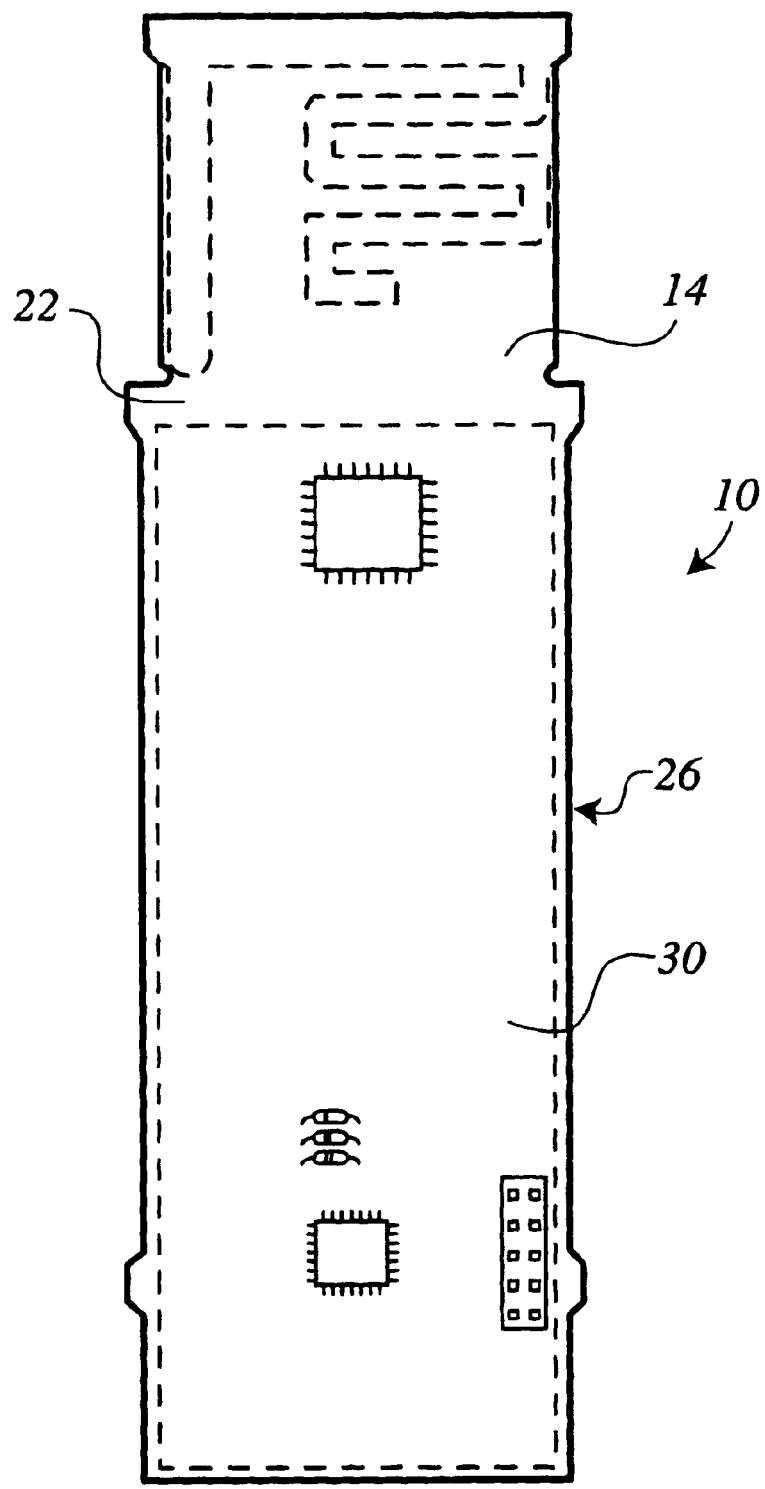
FIG. 2 is a back side view of the printed circuit board illustrated in FIG. 1.

Referring first to FIGS. 1 and 2, thereshown is the printed circuit board antenna 10 of the present invention. FIG. 1 illustrates the back surface 12 of the circuit board antenna, while FIG. 2 illustrates the front surface 14 of the same antenna structure 10. As is illustrated best in FIG. 1, the circuit board antenna 10 is formed on a dielectric substrate, such as printed circuit board 16 that extends from a first end 18 to a second end 20. In the preferred embodiment of the invention, the dielectric substrate is the conventional printed circuit board 16 (PCB), although other types of dielectric substrates are contemplated as being within the scope of the present invention.

Figure 3:
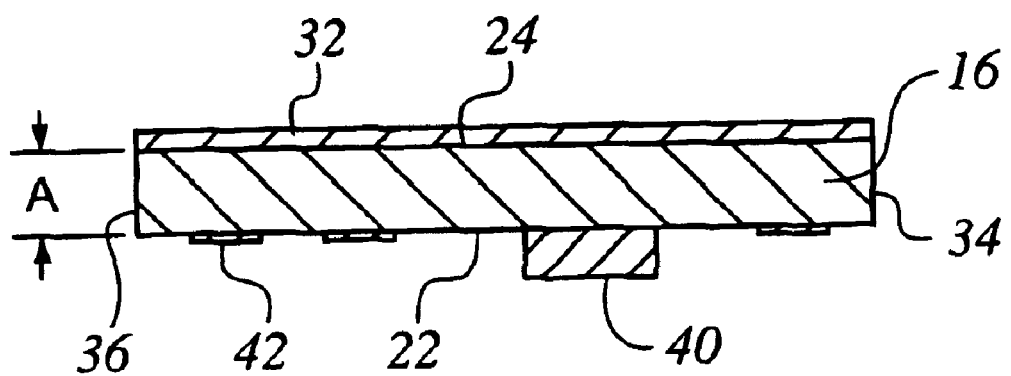
FIG. 3 is a section view taken along line 3—3 of FIG. 1 illustrating the circuit board and ground plane.

In the embodiment of the invention illustrated in FIG. 1, the circuit board 16 is a single, unitary structure that extends from the first end 18 to the second end 20. The circuit board 16 is a thin, planar dielectric material that includes a first substantially planar surface 22 and a second substantially planar surface 24, as illustrated in FIG. 3. As shown in FIG. 3, a first planar surface 22 and the second planar surface 24 of the circuit board 16 are separated by a material thickness A. In the preferred embodiment to the invention, the printed circuit board 16 has a material thickness A of between 30 mils and 65 mils, although other thicknesses for the printed circuit board are contemplated as being within the scope of the present invention.

Referring back to FIG. 1, the printed circuit board 16 includes both a component mounting section 26 and an antenna section 28. In the preferred embodiment of the invention, the component mounting section 26 and the antenna section 28 are integrally formed with each other and are separated along an area aligned with the mounting tabs 29.

Referring now to FIG. 2, the component mounting section 26 includes various electronic circuitry for driving and receiving signals from the printed antenna of the present invention. Specifically, the electronic circuitry defines an antenna driving circuit 30 for applying and receiving radio frequency energy to and from the printed antenna of the present invention. The antenna driving circuit 30 is mounted on the first planar surface 22 of the circuit board 16 in a known manner, such as by automated surface mount technology techniques. The antenna driving circuit 30 is of conventional configuration and is well known to those skilled in the art. Many different configurations for the antenna driving circuit 30 are contemplated as being within the scope of the present invention. The specific configuration of any one of the antenna driving circuit 30 is not shown, since the specific configuration of the antenna driving circuit 30 does not form part of the present invention.

Referring back to FIG. 1, the component mounting section 26 includes a layer of electrically conductive material 32 covering substantially all of the second planar surface 24 along the component mounting section 26. The coating of electrically conductive material 32 is preferably an applied copper coating that defines a ground plane for the printed circuit board antenna 10. Although copper is used in the present invention, other conductive coatings, such as gold, silver, etc., are contemplated as being within the scope of the present invention. The ground plane defined by the electrically conductive material 32 acts as a radiating element for transmitting electromagnetic waves generated by the antenna driving circuitry 30.

The ground plane formed by the layer of electrically conductive material 32, as illustrated in FIG. 3, extends across substantially the entire width of the printed circuit board 16, from a first edge 34 to a second edge 36. The first edge 34 and the second edge 36 define the width of the component mounting section 26, as illustrated in FIG. 1. The ground plane created by the electrically conductive material 32 extends along a center axis 33 and has a length from the first end 18 to an edge surface 38 generally parallel to the center axis. The ground plane defined by the electrically conductive material 32 is centered along the center axis 33 and has a length that is greater than the width of the ground plane extending between the first edge 34 and the second edge 36. In the embodiment of the invention illustrated in FIG. 1, the ground plane has a width of approximately 1.130 inches and has a length of approximately 3 inches. Thus, the ground plane formed by the electrically conductive material 32 covers substantially the entire second planar surface 24 of the component mounting section 26.

As previously discussed, the antenna driving circuit 30 and the remaining electronic components required to operate the printed circuit board antenna 10 are mounted to the first planar surface 22 of the circuit board 16 and generally overly the electrically conductive material 32 forming the ground plane. FIG. 3 generally illustrates the components of the antenna driving circuit 30, including specific circuit members 40 and electrical surface traces 42. As previously discussed, the specific configuration of the antenna driving circuit 30 and the electrical surface traces 42 are shown for illustrative purposes only and form no part of the present invention.

As discussed previously, the main radiating element of the printed circuit board antenna of the present invention is generally comprised of the electrically conductive material 32, such as copper, that is disposed on the second planar surface 24 of the component mounting section 26. The radiating element functions as a portion of a ½ wavelength dipole antenna. Although the radiating element formed by the electronically conductive material 32 is able to transmit and receive electromagnetic waves, an impedance matching component is required to match the driving impedance of the electrical circuitry that forms the antenna driving circuit 30.

In accordance with the present invention, when the antenna is used to transmit signals in the range 900 MHz–930 MHz, it is usually driven by a circuit that requires an impedance of approximately 50 ohms. Therefore, an impedance matching circuit that offsets the antenna impedance as close to 50 ohms is desired. The proper impedance matching facilitates proper operation of the system, in both the receive and transmit modes.

Referring now to FIG. 1, the antenna section 28 includes a specifically designed radiating and impedance matching trace 44. The radiating and impedance matching trace 44 is coupled to the antenna driving circuit 30 through a connective strip 46. Thus, the trace 44 is electrically connected to the antenna driving circuit 30. However, the radiating and impedance matching trace 44 is contained entirely on the antenna section 28 and is spaced from and does not overly any portion of the electrically conductive material 32 that forms a ground plane for the antenna structure of the present invention.

In the preferred embodiment of the invention, the radiating and impedance matching trace 44 is comprised of a layer of electrically conductive material, such as copper, disposed on the second planar surface 24 of the circuit board 16. The copper material includes a protective outer coating, as is conventional.

As can be seen in FIG. 1, the trace 44 includes a radiating strip 46 that is positioned generally adjacent to the first edge 48 of the antenna section 28. The radiating strip 46 extends from a first end 50 to a second end 52 and is generally parallel to the longitudinal center axis 33 of the circuit board 16. The radiating strip 46 has a length of approximately 1.0 inches from the first end 50 to the second end 52 and has a width of approximately 0.1 inches.

The radiating strip 46 extends parallel to the center axis 33 and combines with the radiating element formed by the electrically conductive material 32 to transmit electromagnetic waves from the printed circuit board antenna 10 of the present invention. Since the radiating strip 46 extends generally parallel to the length of the electrically conductive material 32 that forms the ground plane, the radiating strip 46 enhances the radiation pattern generated by the antenna 10.

The radiating strip 46 is coupled to an impedance matching strip 56. The impedance matching strip 56 of the preferred embodiment of the invention illustrated in FIG. 1 has a generally serpentine configuration and has an overall length selected to match the approximately 50 ohms impedance of the antenna driving circuit 30, as previously discussed. The impedance matching strip 56 shown in FIG. 1 includes a first leg 58 that is perpendicular to the radiating strip 46 as positioned adjacent to the second end 20 of the antenna section 28. The first leg 58 extends along the entire width of the antenna section 28 from the first edge 48 to the second edge 60 and has a length of approximately 1.050 inches.

As can be seen in FIG. 1, the impedance matching strip 56 further includes a second leg 62 joined to the first leg by a connecting section 64. The second leg 62 has a length less than the length of the first leg 58. The length of the second leg 62 is approximately 0.615 inches in the preferred embodiment illustrated.

The second leg 62 is joined to a third leg 66 having the same overall length by a second connecting section 68. The third leg 66 is connected to a fourth leg 70, also having the same overall length, by a third connecting section 72. As illustrated in FIG. 1, the first leg 58, the second leg 62, the third leg 64, and the fourth leg 70 are all parallel to each other and perpendicular to the radiating strip 46. The combination of the parallel legs and connecting sections function as an impedance matching circuit for the antenna driving circuit.

The impedance matching strip 56 further includes a stub portion 74 extending from a fourth connecting section 73. The stub portion 74 has a length less than the length of the fourth leg 70. The length of the stub portion 74 can be modified to fine tune the impedance matching characteristics of the impedance matching strip 56 to the specific antenna driving circuit 30 to provide more accurate and specific impedance matching. The sub portion 74 can be easily and readily modified during construction of the printed circuit antenna 10 without requiring a redesign of the entire impedance matching strip 56.

Figure 4:
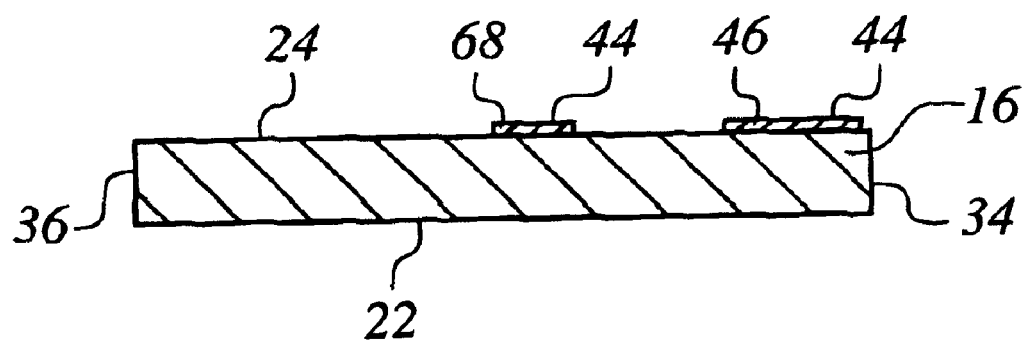
FIG. 4 is a section view taken along line 4—4 of FIG. 1 illustrating the radiating strip and impedance matching strip formed on the antenna section of the circuit board.

Referring now to FIG. 4, the first planar surface 22 of the circuit board 16 is devoid of any electrically conductive material along the antenna section 28 such that the radiating strip 44 and the impedance matching strip 56 are able to transmit radiation without interference from any underlying electrically conductive material.

Figure 7:
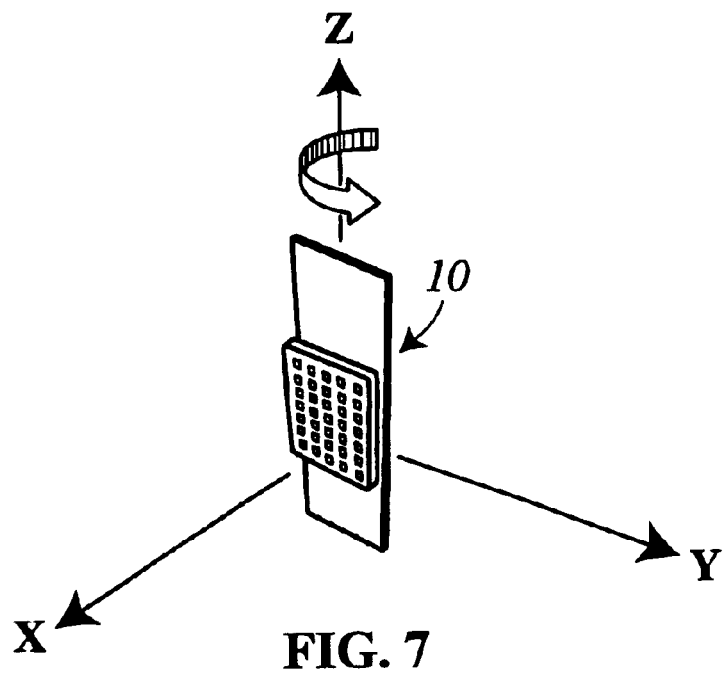
FIG. 7 is a perspective illustration showing the rotation of the printed circuit board antenna structure during radiation testing.

Referring now to FIGS. 7–11, the improved performance of the printed circuit board antenna 10 illustrated in FIGS. 1 and 2 will now be described. Initially, FIG. 7 illustrates the printed circuit board antenna 10 of the present invention as positioned along an X-Y-Z coordinate system. The X-Y-Z coordinate system shown in FIG. 7 will be used as a reference for the radiating result to be described as follows.

Figure 8:
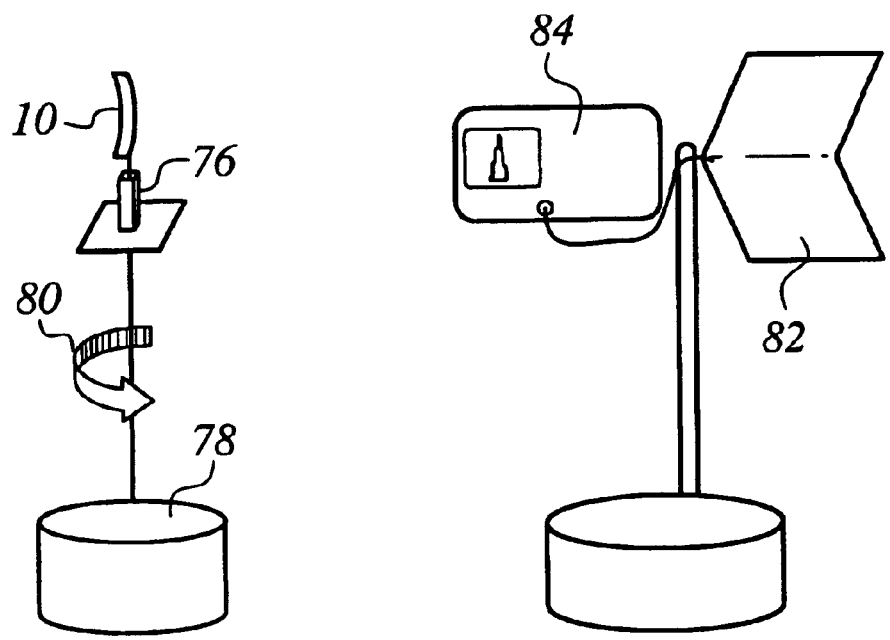
FIG. 8 is a representative illustration showing the method used to measure the radiation parameters of the antenna structure of the present invention.

Referring now to FIG. 8, thereshown is a conventional method of measuring the radiation properties of the antenna 10. As illustrated, the antenna 10 is mounted to a signal source 76 and rotated absent an axis by a gear and encoder 78, as illustrated by arrow 80. The embodiment of the invention illustrated in FIG. 8, the antenna 10 is being rotated about the Z axis. In addition to being rotated about the Z axis, the antenna 10 is remounted such that the rotating gear and encoder 78 rotate the antenna 10 about the X and Y axes independently while measurements are being recorded.

The analysis system includes a receiving antenna 82 positioned a desired distance from the transmitting antenna 10. The receiving antenna 82 is coupled to a spectrum analyzer 84 and specific measurements are made as to the signal received from the printed circuit board antenna 10.

Figure 9:
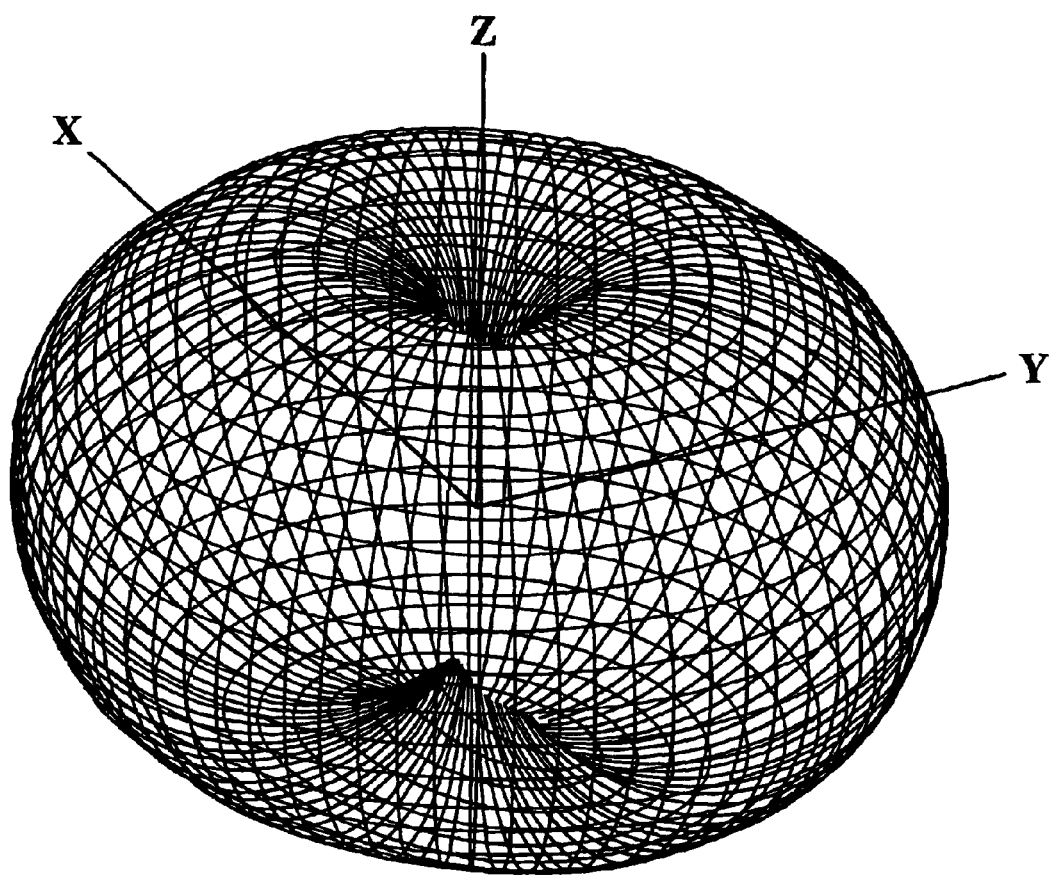
FIG. 9 is the 3-D radiation pattern for the printed circuit board antenna structure of the present invention.

Referring first to FIG. 9, thereshown is the predicted radiation pattern of the antenna about the X, Y and Z axes. As illustrated in FIG. 9, the printed circuit board antenna 10 of the present invention exhibits a uniform radiation pattern both above and below the antenna.

Figure 10:
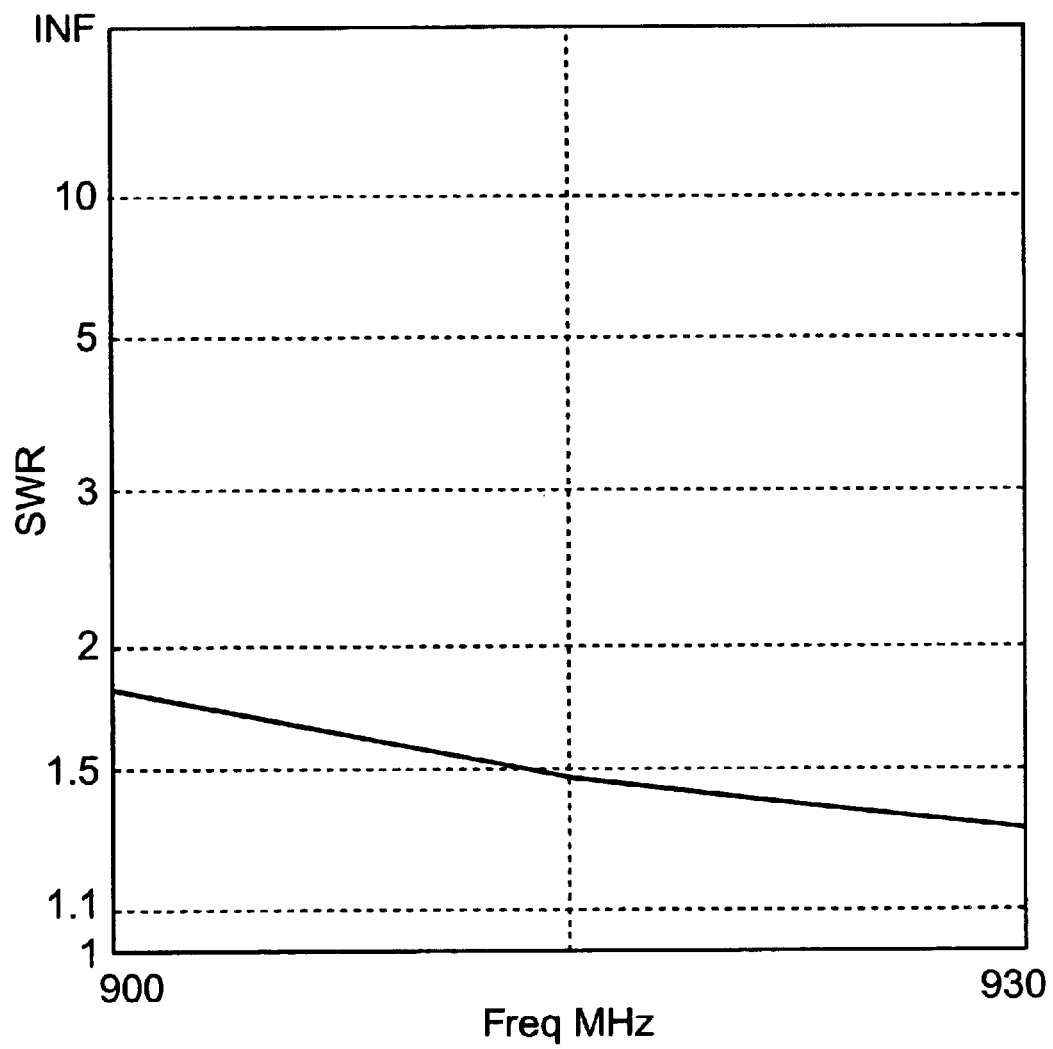
FIG. 10 is a graph illustrating the SWR over a frequency range of 900 MHz to 930 MHz.

FIG. 10 illustrates the predicted standing wave ratio (SWR) for a frequency range between 900 MHz and 930 MHz. As illustrated, the SWR varies from approximately 1.8 to 1.3 as the frequency changes from 900 MHz to 930 MHz. The SWR rises as the frequency changes up to 960 MHz. The antenna of the present invention is intended to be used from approximately 900 MHz to approximately 960 MHz.

Figure 11:
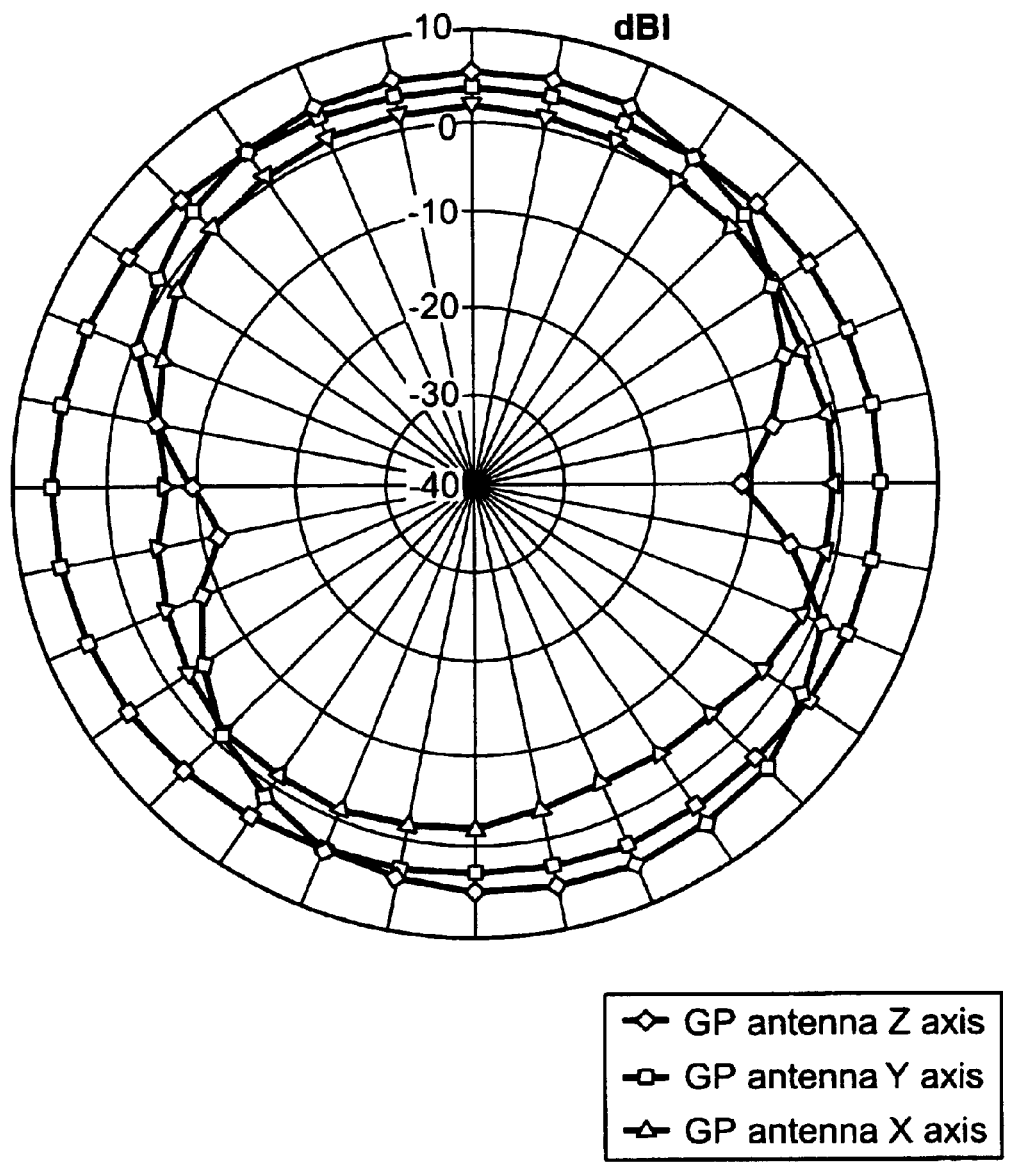
FIG. 11 is a graph illustrating the measured radiation of the antenna of the present invention as the antenna is rotated about an X, Y and Z axis.

Referring now to FIG. 11, thereshown is the measured radiation pattern for the antenna of the present invention as the antenna is rotated 360 degrees about the X, Y and Z axes.

Figure 5:
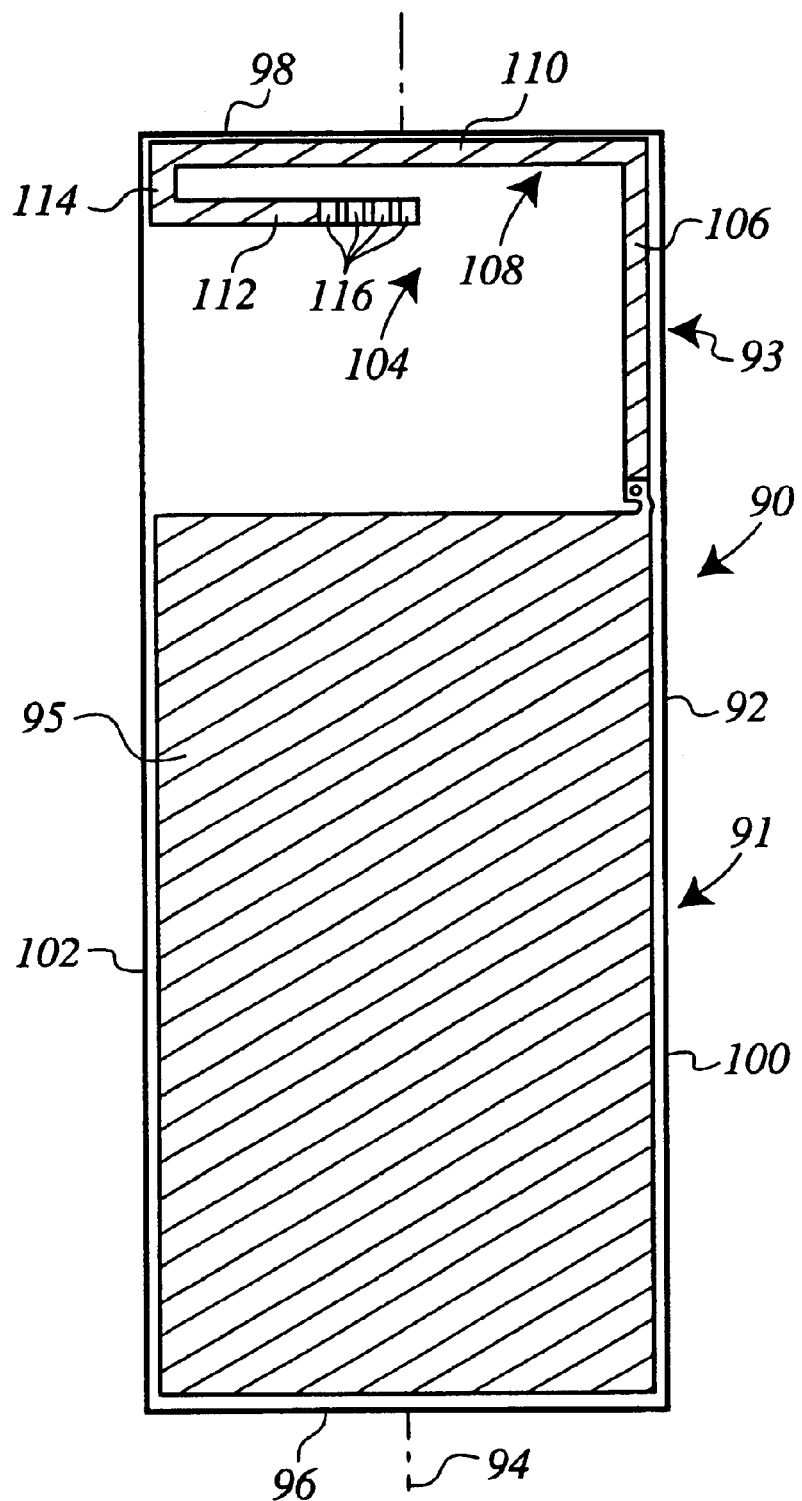
FIG. 5 is a front plan view of a second embodiment of the antenna structure of the present invention.
Figure 6:
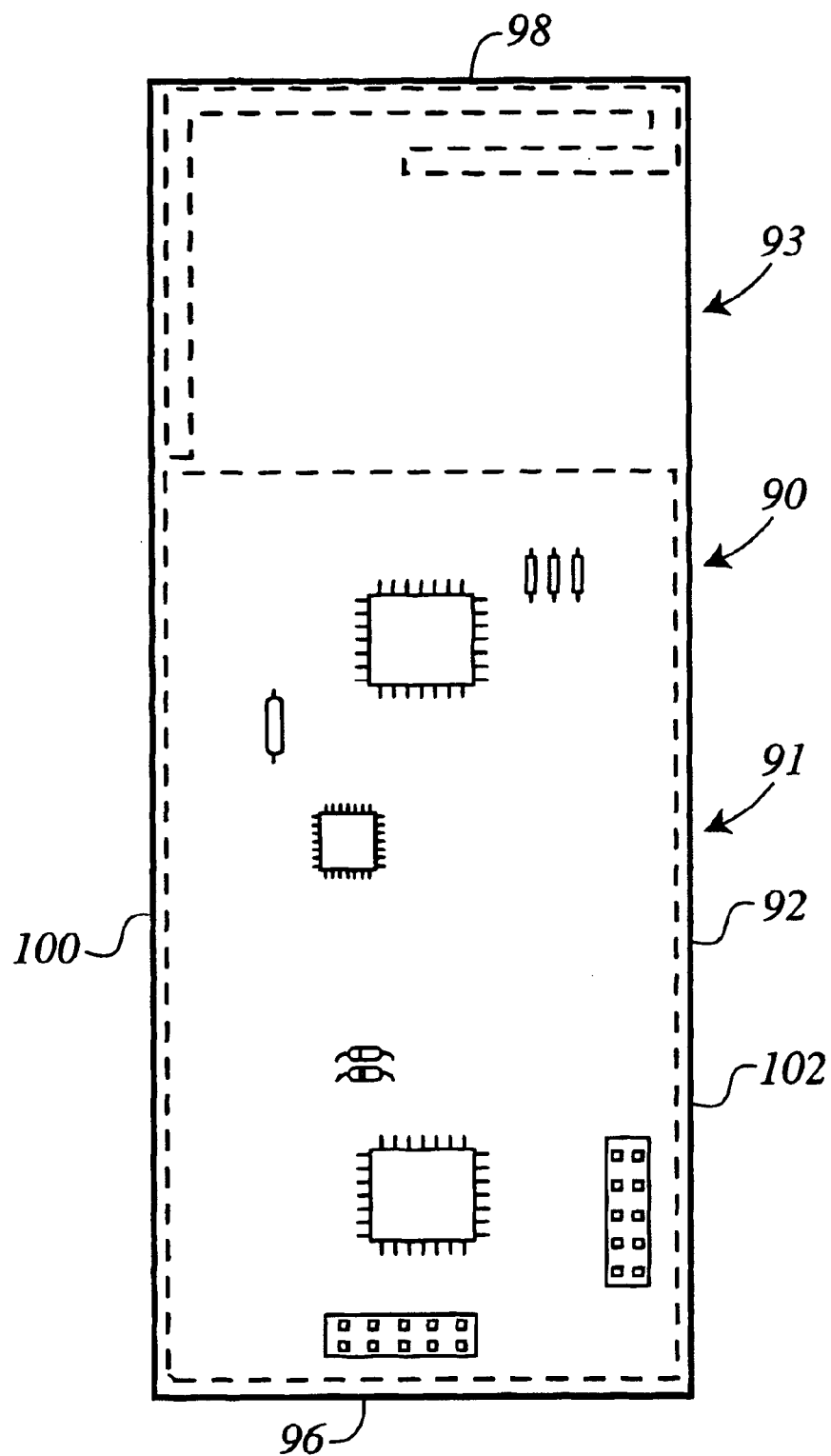
FIG. 6 is a back view of the antenna structure shown in FIG. 5.

Referring now to FIGS. 5 and 6, thereshown is an alternate embodiment of the printed circuit board antenna of the present invention, as referred to by reference numeral 90. The printed circuit board antenna 90 includes a circuit board 92 that extends along the central axis 94 from a first end 96 to a second end 98. The printed circuit board antenna 90 includes the component mounting section 91 and an antenna section 93, as was the case with the first embodiment shown in FIGS. 1 and 2. However, in the second embodiment shown in FIG. 5, the width of the antenna from the first side edge 100 to the second side edge 102 is approximately 1.50 inches, while the length of the circuit board from the bottom edge 96 to the top edge 98 is approximately 4.0 inches. Once again, the component mounting section 91 includes a layer of electrically conductive material 95 formed on the second planar surface, which defines the ground plane. However, since the physical configuration of the electrically conductive material 95 defining the ground plane is different than the first embodiment of FIGS. 1–2, the configuration of the radiating and impedance matching trace 104 is slightly modified.

The trace 104 includes the radiating strip 106 positioned adjacent to the side edge 100 and extending generally parallel to the center axis 94. The radiating strip 106 has a length of approximately 1.0 inches and a width of approximately 0.1 inches. The radiating strip is coupled to an impedance matching strip 108.

The impedance matching strip 108 includes a first leg 110 extending perpendicular to both the center axis 94 and the radiating strip 106. The first leg 110 has a length of slightly less than 1.50 inches and is positing adjacent to the top edge 98. The first leg 110 is joined to a second, parallel leg 112 by a connecting portion 114. The second leg 112 has a length substantially less than the length of the first leg 110. In the preferred embodiment of the invention, the second leg 112 has a length of approximately 0.80 inches. The second leg 112 acts as a turning stub and as such includes several adjustment tabs 116. The adjustment tabs 116 allow the manufacturer of the printed circuit board antenna 90 to specifically match the impedance of the second leg 112 to the antenna and driving circuit 30.

Although not shown in the drawings of the present application, the predicted performance characteristics of the second printed circuit board antenna 90 illustrated in FIGS. 5 and 6 is anticipated to be similar to the performance characteristics of the embodiments shown in FIGS. 1 and 2, as detailed in the remaining Figures of the present application.

While the preferred embodiment of the printed antenna has been described with certain particularity for the purposes of illustration, it should be noted that various modifications may be made while keeping within the spirit of the present invention. For example, while the specific lengths and configuration of the impedance matching strip is shown in the Figs., it should be understood that the impedance matching strip could be configured in different manners to provide the required impedance matching for the antenna driving circuit. Additionally, although specific dimensions for the circuit board are described in the preferred embodiment of the invention, it should be understood that different circuit board sizes could be utilized and would result in a different configuration of the impedance matching strip.

Additionally, although the present invention is described as being particularly desirable in transmitting RF signals from commodity measuring devices, such as electric meters, gas meters and water meters, it should be understood that the printed circuit board antenna of the present invention could be utilized in many other operating environments while operating within the scope of the present invention.

Various alternatives and embodiments are contemplated as being within the scope of the following claims particularly pointing out and distinctly claiming the subject matter regarded as the invention.

I claim:

1. A printed antenna assembly for the transmission of electromagnetic waves, the printed antenna comprising:
   a substantially planar circuit board having a first planar surface and a second planar surface, the first and second planar surfaces being parallel and spaced by a material thickness, the circuit board including a mounting section and an antenna section integrally formed with each other;
   an antenna driving circuit mounted to the first surface of the mounting section for generating electromagnetic waves to be transmitted by the printed antenna;
   a coating of electrically conductive material covering substantially all of the second planar surface of the mounting section of the circuit board, wherein the conductive material forms a ground plane for the circuit board and provides a radiating element for transmitting the electromagnetic wave;
   a radiating strip formed on the antenna section of the circuit board and coupled to the radiating element for aiding in the transmission of electromagnetic waves; and
   an impedance matching strip formed on the antenna section of the circuit board and coupled to the radiating strip, the impedance matching strip having an overall length selected to substantially match the impedance of the antenna driving circuit.

2. The printed antenna assembly of claim 1 wherein the impedance matching strip and the radiation strip are formed on the second side of the printed circuit board.

3. The printed antenna assembly of claim 2 wherein the impedance matching strip and the radiating strip are integrally formed with each other and are formed from electrically conductive material applied to the second surface of the antenna section.

4. The printed antenna assembly of claim 1 wherein the mounting section of the circuit board extends along a center axis and has a length parallel to the center axis that is greater than a width perpendicular to the center axis.

5. The printed antenna assembly of claim 4 wherein the radiation strip extends parallel to the center axis of the mounting section.

6. The printed antenna assembly of claim 5 wherein the impedance matching strip includes at least a first leg formed on the antenna section and extending perpendicularly to the radiation strip.

7. The printed antenna assembly of claim 4 wherein the mounting section includes a first edge surface and a second edge surface that define the width of the mounting section, the antenna section including a first edge surface generally parallel to and extending from the first edge surface of the mounting section, wherein the radiating strip is adjacent to the first edge of the antenna section.

8. A printed antenna assembly for the transmission of electromagnetic waves, the printed antenna comprising:

a substantially planar circuit board having a first planar surface and a second planar surface, the first and second planar surfaces being parallel and spaced by a material thickness, the circuit board including a mounting section extending along a center axis and an antenna section integrally formed with mounting section;

an antenna driving circuit mounted to the first surface of the mounting section for generating electromagnetic waves to be transmitted by the printed antenna;

a coating of electrically conductive material covering substantially all of the second planar surface of the mounting section of the circuit board, wherein the conductive material forms a ground plane for the circuit board and provides a radiating element for transmitting the electromagnetic wave;

a radiating strip formed on the antenna section of the circuit board and coupled to the radiating element for aiding in the transmission of electromagnetic waves, the radiating strip extending parallel to the center axis of the mounting section; and an impedance matching strip formed on the antenna section of the circuit board and coupled to the radiating strip, the impedance matching strip having an overall length selected to substantially match the impedance of the antenna driving circuit, wherein the impedance matching strip includes a first leg formed on the antenna section extending perpendicularly to the radiation strip and a second leg coupled to the first leg and extending parallel to the first leg.

9. The printed antenna assembly of claim 8 wherein the second leg is shorter than the first leg.

10. A printed antenna assembly for the transmission of electromagnetic waves, the printed antenna comprising:

a substantially planar circuit board having a first planar surface and a second planar surface, the first and second planar surfaces being parallel and spaced by a material thickness, the circuit board including a mounting section extending along a center axis and an antenna section integrally formed with the mounting section;

an antenna driving circuit mounted to the first surface of the mounting section for generating electromagnetic waves to be transmitted by the printed antenna;

a coating of electrically conductive material covering substantially all of the second planar surface of the mounting section of the circuit board, wherein the conductive material forms a ground plane for the circuit board and provides a radiating element for transmitting the electromagnetic wave;

a radiating strip formed on the antenna section of the circuit board and coupled to the radiating element for aiding in the transmission of electromagnetic waves, the radiation strip extending parallel to the center axis of the mounting section; and an impedance matching strip formed on the antenna section of the circuit board and coupled to the radiating strip, the impedance matching strip having an overall length selected to substantially match the impedance of the antenna driving circuit, wherein the impedance matching strip includes a plurality of legs each extending perpendicular to the radiating strip, wherein the plurality of legs are coupled to each other and spaced from each other to define a serpentine pattern.

11. A printed antenna for the transmission of electromagnetic waves, the printed antenna comprising:

a substantially planar circuit board formed from a dielectric material and having a first planar surface and a second planar surface, the first and second planar surfaces being parallel and spaced by a material thickness, the circuit board having a first edge surface and a second edge surface equally spaced from a center axis;

a mounting section contained on the circuit board;

an antenna section contained on the circuit board and integrally formed with the mounting section;

a coating of electrically conductive material applied to the second planar surface and covering substantially all of the mounting section of the circuit board, wherein the conductive material forms a ground plane for the circuit board and functions as a radiating element for transmitting electromagnetic waves; and a radiating and impedance matching trace formed on the second planar surface of the antenna section of the circuit board, the radiating and impedance matching trace including a radiating strip extending parallel to the center axis of the circuit board and an impedance matching strip coupled to the radiating strip and having at least a first leg positioned perpendicular to the radiating strip.

12. The printed antenna assembly of claim 11 wherein the radiating strip is positioned adjacent to the first edge of the circuit board along the antenna section.

13. The printed antenna assembly of claim 11 further comprising an antenna driving circuit mounted to the first surface of the mounting section for generating electromagnetic waves to be transmitted by the printed antenna.

14. A printed antenna for the transmission of electromagnetic waves, the printed antenna comprising:

a substantially planar circuit board formed from a dielectric material and having a first planar surface and a second planar surface, the first and second planar surfaces being parallel and spaced by a material thickness, the circuit board having a first edge surface and a second edge surface equally spaced from a center axis;

a mounting section contained on the circuit board;

an antenna section contained on the circuit board and integrally formed with the mounting section;

a coating of electrically conductive material applied to the second planar surface and covering substantially all of the mounting section of the circuit board, wherein the conductive material forms a ground plane for the circuit board and functions as a radiating element for transmitting electromagnetic waves; and a radiating and impedance matching trace formed on the second planar surface of the antenna section of the circuit board, the radiating and impedance matching trace including a radiating strip positioned adjacent to the first edge of the circuit board and extending parallel to the center axis of the circuit board and an impedance matching strip coupled to the radiating strip and having at least a first leg positioned perpendicular to the radiating strip, wherein the first leg of the impedance matching strip is formed along the top edge of the circuit board and extends perpendicular to the radiating strip.

15. The printed antenna assembly of claim 14 wherein the impedance matching strip includes at least a second leg coupled to the first leg and extending parallel to the first leg.

16. The printed antenna assembly of claim 15 wherein the second leg is shorter than the first leg.

17. A printed antenna for the transmission of electromagnetic waves, the printed antenna comprising:

a substantially planar circuit board formed from a dielectric material and having a first planar surface and a second planar surface, the first and second planar surfaces being parallel and spaced by a material thickness, the circuit board having a first edge surface and a second edge surface equally spaced from a center axis;

a mounting section contained on the circuit board;

an antenna section contained on the circuit board and integrally formed with the mounting section;

a coating of electrically conductive material applied to the second planar surface and covering substantially all of the mounting section of the circuit board, wherein the conductive material forms a ground plane for the circuit board and functions as a radiating element for transmitting electromagnetic waves; and a radiating and impedance matching trace formed on the second planar surface of the antenna section of the circuit board, the radiating and impedance matching trace including a radiating strip extending parallel to the center axis of the circuit board and an impedance matching strip coupled to the radiating strip, wherein the impedance matching strip includes a plurality of legs each extending perpendicular to the radiating strip, wherein the plurality of legs are coupled to each other and spaced from each other to define a serpentine pattern.

18. A printed antenna assembly for the transmission of electromagnetic waves, the printed antenna comprising:

a substantially planar circuit board extending along a center axis and having a first planar surface and a second planar surface;

a coating of electrically conductive material covering a portion of the second planar surface of the circuit board, the coating of electrically conductive material forming a ground plane for the circuit board and providing a radiating element for the transmission of electromagnetic waves;

a radiating strip formed on the second planar surface of the circuit board, the radiating strip extending parallel to the center axis of the circuit board; and an impedance matching strip formed on the second planar surface of the circuit board and coupled to the radiating strip, the impedance matching strip including at least a first leg extending perpendicular to the radiating strip and being electrically coupled thereto.

19. The printed antenna assembly of claim 18 further comprising an antenna driving circuit mounted to the first surface of the circuit board, the antenna driving circuit being mounted to the circuit board opposite the coating of electrically conductive material that forms the ground plane.

* * * * *